United States Patent [19]
Kible

[11] Patent Number: 4,613,777
[45] Date of Patent: Sep. 23, 1986

[54] BINARY SIGNAL COMPARATOR USING TWO D FLIP-FLOPS FOR PRECISE TRIGGERING

[75] Inventor: Dieter Kible, Gartringen, Fed. Rep. of Germany

[73] Assignee: Hewlett-Packard Company, Palo Alto, Calif.

[21] Appl. No.: 684,996

[22] Filed: Dec. 20, 1984

[30] Foreign Application Priority Data

Dec. 24, 1983 [DE] Fed. Rep. of Germany ....... 3346942

[51] Int. Cl.[4] ............................................ H03K 17/13
[52] U.S. Cl. .................................... 307/591; 307/443; 307/480; 307/491; 307/517; 307/362; 307/242; 307/269; 307/272 A; 307/601; 307/602; 328/196
[58] Field of Search ................... 307/200 A, 443, 445, 307/446, 480, 481, 491, 494, 498, 510, 517, 518, 529, 354, 362, 242, 269, 272 R, 272 A, 591, 593, 601, 602, 608, 247 A; 328/75, 117, 196, 132, 114

[56] References Cited

U.S. PATENT DOCUMENTS

| | | | |
|---|---|---|---|
| 3,675,047 | 7/1972 | Vahlstrom et al. | 307/602 X |
| 3,725,792 | 4/1973 | Kellogg | 307/443 X |
| 3,952,213 | 4/1976 | Fukaya | 307/602 X |
| 4,287,442 | 9/1981 | Spinks et al. | 307/510 |
| 4,352,999 | 10/1982 | Galpin | 307/354 |
| 4,370,569 | 1/1983 | Hunsinger | 307/602 X |
| 4,531,223 | 7/1985 | Ashida | 307/518 X |

FOREIGN PATENT DOCUMENTS

| | | | |
|---|---|---|---|
| 0121049 | 9/1979 | Japan | 307/511 |
| 0205329 | 11/1983 | Japan | 307/517 |

Primary Examiner—Stanley D. Miller
Assistant Examiner—D. R. Hudspeth
Attorney, Agent, or Firm—Douglas A. Kundrat

[57] ABSTRACT

A binary signal comparator for comparing the level of an unknown signal to a reference signal during a time window period has a first flip-flop for detecting a difference at the start of the period and a second flip-flop for detecting a difference at any later time during the period. The outputs of the two flip-flops are combined in an OR combination so that the final output produces a comparison of the two signals during the entire time window period.

18 Claims, 9 Drawing Figures

BINARY SIGNAL COMPARATOR USING TWO D FLIP-FLOPS FOR PRECISE TRIGGERING

BACKGROUND AND SUMMARY OF THE INVENTION

The present invention relates to a binary signal comparator circuit which may be used, for example, in the functional test of medium- and large-scale integrated circuits such as microprocessors and semiconductor memory devices and which may also be used in the test of assembled printed circuit boards. In such tests a comparator is used to compare an unknown binary signal with a reference signal during the entire duration of a predetermined time window. In one typical prior art functional tester having such a comparator (the Hewlett-Packard Company model 8182A Data Analyzer) the unknown and reference signals are connected to the inputs of an exclusive-OR gate. The exclusive-OR gate issues an error-indicating binary 1 comparison signal to a following AND gate if at any time the binary level of the unknown signal differs from the binary level of the reference signal. The AND gate is clocked open for the duration of the time window by a window signal and the AND gate generates a binary 1 error signal if a binary 1 compare signal is received at any time within the time window.

Unfortunately, the AND gates used in these prior art comparators have non-zero rise and fall times which are typically on tne order of 2-4 nanoseconds for ECL (emitter coupled logic) devices. In such prior art comparators 2-4 nanosecond uncertainty intervals exist at the beginning and at the end of the time window and in these uncertainty intervals a binary 1 compare signal may not be recognized because of the uncertain temporal overlap of the window and compare signals.

In accordance with the illustrated preferred embodiment of the present invention a binary signal comparator circuit operates with uncertainty intervals which are substantially reduced in duration from those in prior art comparators. An errorindicating binary 1 compare signal is generated, for example by an exclusive-OR gate, to indicate that the reference and unknown signals differ. The compare signal is monitored for the entire duration of the time window by a combination of two edgetriggered D-type flip-flops or equivalent bistable circuits. In such devices sampling is triggered by an edge of a clock signal and the delay between the clock signal edge and the sample time at which sampling actually occurs varies from sample to sample by a typical jitter amount in the range of only plus or minus 100 picoseconds. The first flip-flop is clocked by the rising edge of the window signal and stores the compare signal binary level then present. However, a binary 1 compare signal occuring later in time but still within the time window is not detected by the first flip-flop since no additional clock signal rising edge is available as a trigger. A second flip-flop is used to store such a later occuring binary 1 compare signal. The second flip-flop is triggered by the leading edge of the transition of the compare signal from a binary 0 to a binary 1 and stores the then current binary level of the window signal. The outputs of the two flip-flops may be combined logically in an OR gate so that a binary 1 error signal is provided if a binary 1 compare signal occurs at any time within the time window.

DETAILED DESCRIPTION OF THE PREFERRED EMBODIMENT

Figure 1:
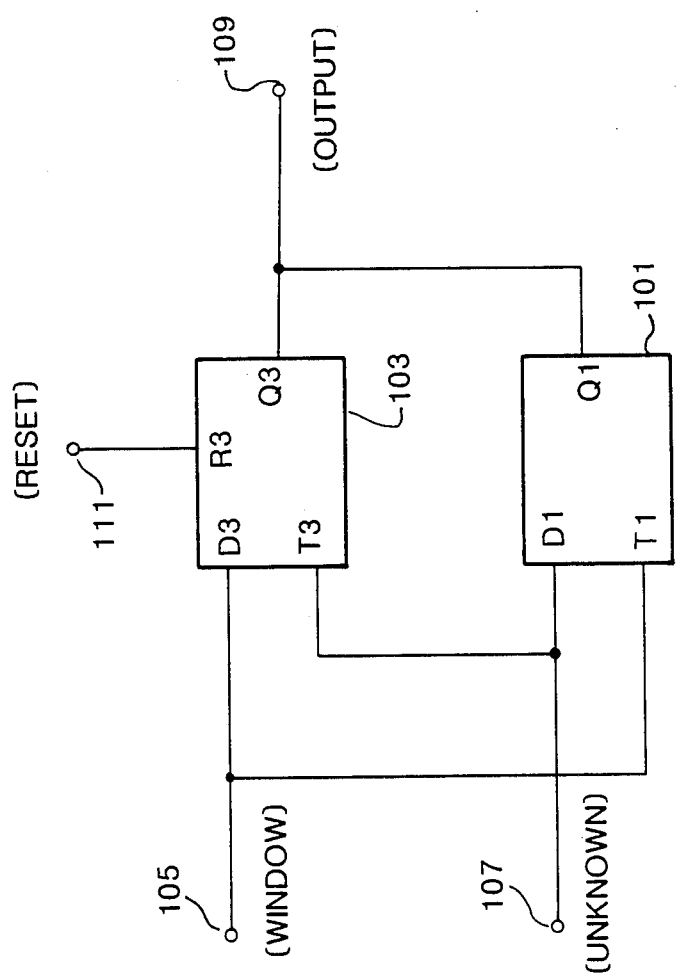
FIG. 1 is a circuit diagram of a preferred embodiment of the present invention.

FIG. 1 is a circuit diagram of a preferred embodiment of the present invention. An unknown binary signal present at an unknown port 107 is compared to a binary reference level of 0 during the entire duration of a time window set by a window signal present at a window port 105. A binary 1 error signal is presented at output port 109 if the binary level of the unknown signal differs from binary 0 at any time during the time window. Alternatively, the results of a continous comparison may be coupled to unknown port 107 so that a binary 1 error signal at ouput 109 indicates that the two inputs to the continuous comparison differ at some point during the time window. For example, an exclusive-OR gate 211 shown in FIG. 3, may be used to detect differences between a reference signal at reference input 225 and the unknown signal at unknown input 227.

Flip-flops 101 and 103 may be edge-triggered ECL devices which are commercially available from, e.g., Motorola Corp. Such devices produce at an output Q1, Q3 the binary level present at a data input D1, D3 at a sample time which is triggered by an edge of a trigger signal present at a trigger input T1, T3. The sample time occurs some delay time before or after the edge selected for triggering (the rising edge is used herein although falling edge triggering is also possible) crosses the midpoint between the binary 0 and 1 levels. The delay time is on the order of 1 nanosecond and varies only in the range of plus or minus 100 picoseconds from sample to sample. A given signal is defined to be at a binary 1 level if the signal is at or above a threshold level located at the midpoint between the binary 0 and 1 levels. Thus, a binary 1 is detected at data input D1, D3 (and presented at output Q1, Q3) if the data input signal is at or above the threshold level when a rising edge of the window signal at the trigger input T1, T3 crosses the threshold level.

The trigger input T1 of flip-flop 101 is coupled to the window port 105 and flip-flop 101 is triggered by a rising edge of the window signal. The data input D1 is coupled to the unknown port 107 so that flip-flop 101 presents at output Q1 the binary level of the unknown signal present at a sample time which is triggered by a rising edge of the window signal. Flip-flop 103 has a trigger input T3 coupled to the unknown port 107 and a data input D3 coupled to the window port 105. Thus, flip-flop 103 presents at output Q3 the binary level of the window signal at a sample time triggered by a rising edge of the unknown signal transitioning from the level of the reference signal (binary 0) to an error level (binary 1). A reset R3 is provided on flip-flop 103 to restore initial conditions. No reset is required for flip-flop 101 since it is clocked by the window signal at the start of each time window. The outputs Q1 and Q3 are connected together in a wired-OR connection so that the signal present at output 109 is the logical OR combination of the signals present at outputs Q1 and Q3. Of course, outputs Q1 and Q3 could instead be connected to a discrete OR gate having output 109.

Figure 2:
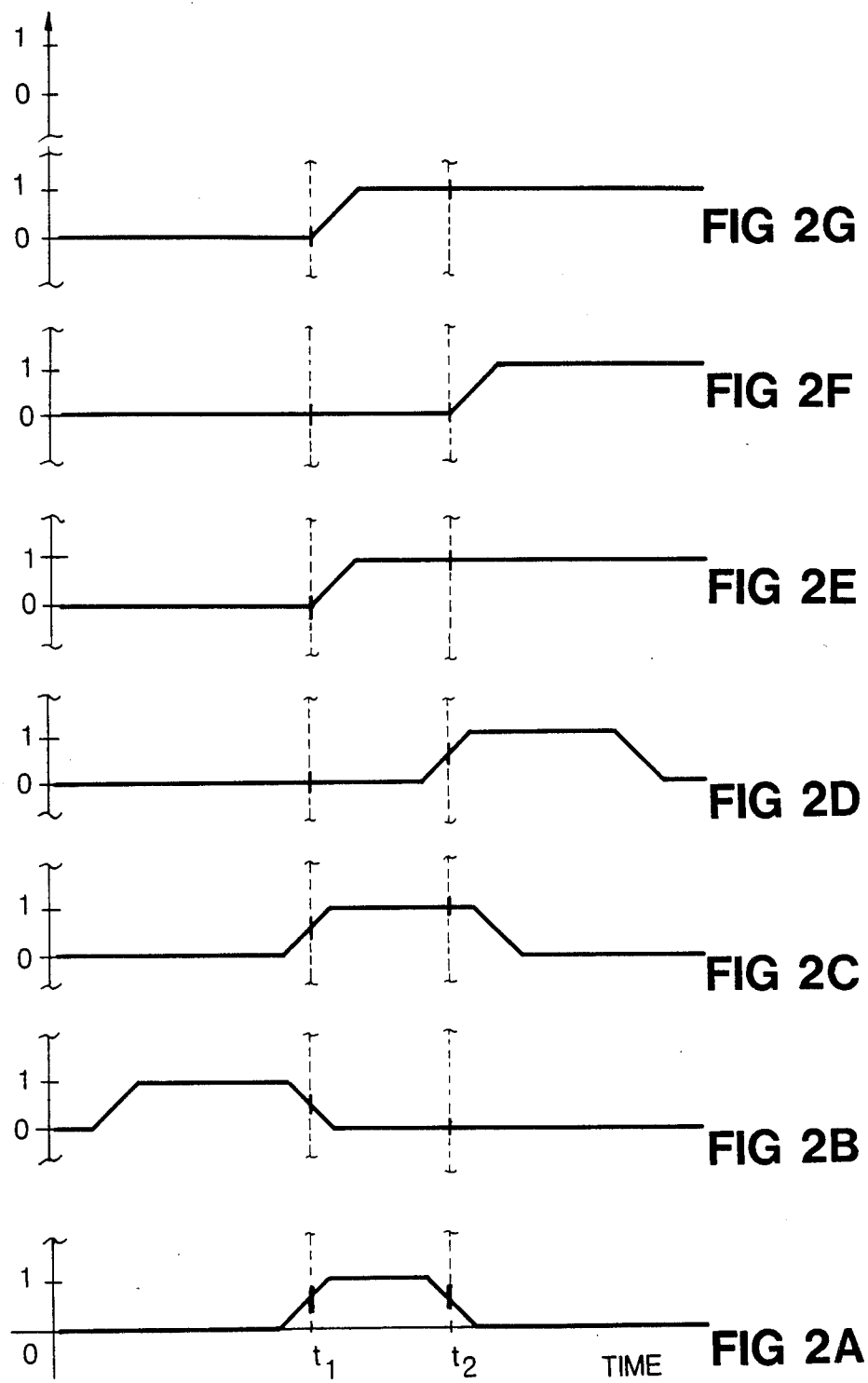
FIGS. 2A-F show typical waveforms which may occur during the operation of the circuit shown in FIG. 1.

FIG. 2 shows the time relationship of various waveforms which may occur in the circuit shown in FIG. 1. As mentioned above, the delay times may vary in the nanosecond range between various flip-flops but delay times in a given flip-flop typically vary only plus or minus 100 picoseconds between measurements. Persons of ordinary skill in the art may easily select flip-flops 101, 103 to have zero delay times or may calibrate or compensate the circuit shown in FIG. 1 to obtain the same effect. By the same methods, the delay times of flip-flops 101 and 103 may be equalized so that sampling may be performed with an accuracy of approximately 100 picoseconds. The waveforms shown in FIG. 2 depict the situation in which the delay times of both flip-flops 101, 103 are equal to 0.

FIG. 2A shows a window signal which is applied to the window input 105 of the circuit shown in FIG. 1. The window signal begins at a binary 0 level, rises to a binary 1 level during a rise time, remains at the binary 1 level for a desired period of time and then declines to a binary 0 level during a fall time. Since the threshold level is is defined to be located midway between the 0 and the 1 binary levels the waveform shown in FIG. 2A is defined to be at a binary 1 level from time $t_1$ through time $t_2$. FIGS. 2B and 2C show two possible unknown signals which may be applied to the unknown port 107 and which both result in a binary 1 being presented at output Q1 of flip-flop 101 since each unknown signal is at or above the threshold level at time $t_1$. Of course, any unknown signal which is above the threshold level at time $t_1$ causes a binary 1 to occur at output Q1.

FIG. 2D shows an unknown signal which is below the threshold level at time $t_1$ with the result that the output at Q1 is held at a binary 0 . But, the waveform shown in FIG. 2D has a rising edge which crosses the threshold level at a time at or between the times $t_1$ and $t_2$. Thus, the unknown waveform clocks the then present value of the window signal (binary 1 in FIG. 2A) into flip-flop 103 and a binary 1 is presented at output Q3. The unknown signals shown in FIGS. 2B-D are merely exemplary and any unknown signal having a level at or above the threshold level at any time at or between times $t_1$ and $t_2$ will cause a binary 1 to be presented at output 109.

FIG. 2E shows the output waveform at output Q1 for the case in which the window signal of FIG. 2A is applied to window input 105 and the unknown signal of either FIG. 2B or FIG. 2C is applied to unknown input 107. In these cases the rising edge of the window signal at time $t_1$ causes the binary 1 then present at the unknown input 105 to be presented at the output Q1 of flip-flop 101 and at output 109.

FIG. 2F shows the state of the output Q3 for the case in which the window signal of FIG. 2A is applied to window input 105 and the unknown signal of FIG. 2D is applied to unknown input 107. In this case the output Q1 is held constant at 0. But, by crossing the threshold level the rising edge of the unknown signal triggers flip-flop 103 and causes the then present binary level of the window signal to be presented at output Q3 and at output 109.

Thus, the circuit shown in FIG. 1 presents a binary 1 at output 109 if a binary 1 is presented at unknown input 107 at any time during the time window. The flip-flop 101 presents a binary 1 at output Q1 if a binary 1 is present at the unknown input 107 at the beginning of the time window. The flip-flop 103 presents a binary 1 at output Q3 if a transition to a binary 1 at unknown input 107 occurs at any later time within the time window. At the end of the time window the status of output 109 may be read and stored as desired by the use of any of a number of various circuits or techniques. The circuit may then be reset by application of a binary 1 reset signal to reset R3 at reset input 111.

The circuit shown in FIG. 1 may easily be modified for operation solely under clock control by applying a continuous binary 1 to the reset input 111. In this mode, edge trigger sampling a rising edge at window input 105 causes flip-flop 101 to present at output Q1 the binary level of the unknown signal then present at unknown input 107. Since the output of flip-flop 103 is continuously held at a binary 0 the level at output 109 is equal to the level at output Q1. The ease with which this modification may be performed is especially advantageous in logic and data analysis instruments.

Figure 3:
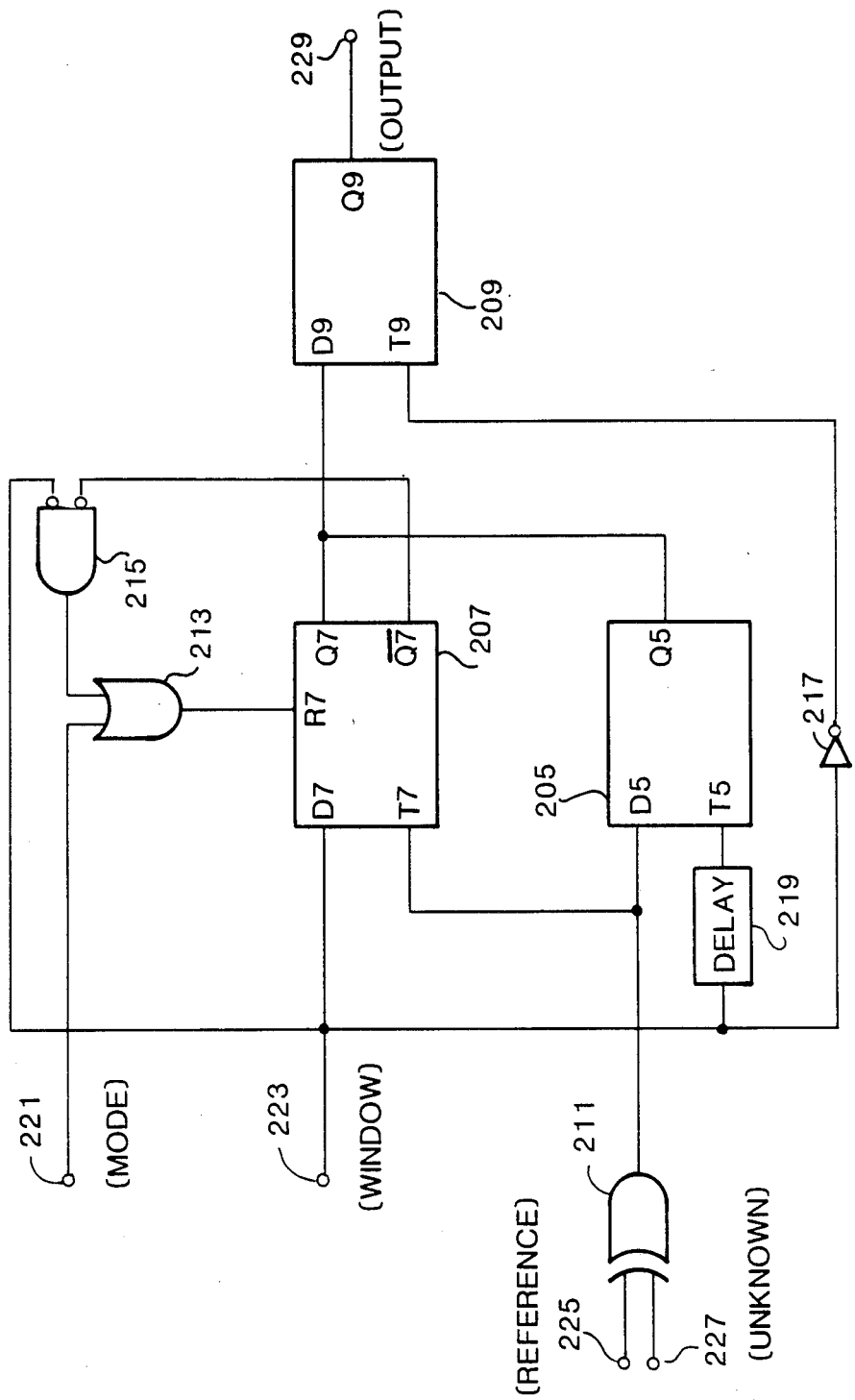
FIG. 3 is a circuit diagram of another preferred embodiment of the present invention.

Since the actual delay time in commercially available flip-flops may vary from device to device it is often desirable to utilize a variable delay to compensate the two flip-flops 101, 103 for each other so that special selection of devices may be avoided. Delay compensation may be added at either of the trigger inputs T1, T3 or at either of the data inputs D1, D3. FIG. 3 shows a particular implementation in which a variable delay 219 is located at the trigger input T5 of a flip-flop 205.

FIG. 3 shows another preferred embodiment of the present invention which provides additional features over those of the circuit shown in FIG. 1. In particular, the circuit shown in FIG. 3 allows the user to select a particular reference level to be used, to store the circuit output at the end of a time window and to reset the circuit automatically. The inputs to flip-flops 205, 207 are connected substantially as shown in FIG. 1 except that the exclusive-OR gate 211 discussed above is used to present a binary 1 error signal and an adjustable delay 219 is connected to input T5 to maximize time accuracy.

Outputs Q5 and Q7 are connected in a wired-OR combination to a D9 input of a flip-flop 209. A window signal at input 223 is inverted by inverter 217 and is presented to a trigger input T9 of flip-flop 209. Complementary output $\overline{Q7}$ is connected to one inverting input of an AND gate 215. The other inverting input of AND gate 215 receives the window signal from window input 223 and the output of AND gate 215 provides a reset signal which is combined in an OR gate 213 with a mode select signal received at a mode input 221. The function of the AND gate 215 with its inverting inputs may be performed by an EXCLUSIVE OR gate followed by an inverter. The output of the OR gate 213 is presented at reset input R7 to select operation of the circuit shown in FIG. 3 as either a comparator or as a sampling circuit. Selection is made by application of either a binary 0 or a binary 1 mode select signal.

The unknown signal at input 227 may be compared with a reference signal having either a binary 0 or a binary 1 level present at input 225. Alternatively, the unknown signal may be inverted before application to input 227 to obtain the same results.

At the end of the window signal presented to input 223 the inverter 217 causes the wired-OR combination of the outputs of flip-flops 205 and 207 to be clocked into input D9 of flip-flop 209. A reset pulse is generated at the end of the time window by presence of a binary 0 at $\overline{Q7}$. This reset pulse is delayed by at least one propagation delay relative to the transport of data into D9.

Thus, resetting occurs automatically and synchronously relative to the comparison operations of the circuit shown in FIG. 3 so that an unknown signal having a high clock rate may easily be tested.

I claim:

1. A detector circuit for detecting a state change of an unknown binary signal during a time window, comprising:

first sample means, having a data input for receiving the unknown signal and a trigger input for receiving a window signal indicative of the time window, for presenting at an output the state of the unknown signal at the start of the time window;

second sample means, having a data input for receiving the window signal and a trigger input for receiving the unknown signal, for presenting at an output the state of the window signal at the state change of the unknown signal; and logic means, coupled to the outputs of the first and second sample means, for presenting at an output the logical OR combination thereof.

2. A circuit as in claim 1, wherein the first and second sample means comprise flip-flops.

3. A circuit as in claim 2, wherein the window signal is at a binary 1 level during the time window and is at a binary 0 level outside of the time window.

4. A circuit as in claim 3, wherein the first and second sample means are operative for triggering on rising edges.

5. A circuit as in claim 4, wherein the state change of the unknown signal to be detected is a change from a 0 binary level to a 1 binary level.

6. A circuit as in claim 5, wherein the second sample means is further operative for resetting the state of the output thereof to a binary 0 level upon receipt of a binary 1 reset signal at a reset input.

7. A circuit as in claim 6, wherein the logic means comprises an OR gate.

8. A circuit as in claim 6, wherein the logic means comprises a wired-OR connection of the outputs of the first and second sample means.

9. A comparator circuit for comparing an unknown binary signal to a reference signal during a time window, comprising:

first logic means, having first and second inputs for receiving the unknown and reference signals, for producing at an output the exclusive-OR combination of the unknown and reference signals;

first sample means, having a data input coupled to the output of the first logic means and a trigger input for receiving a window signal indicative of the time window, for presenting at an output the state of the first logic means output at the start of the time window;

second sample means, having a data input for receiving the window signal and a trigger coupled to the output of the first logic means, for presenting at an output the state of the window signal at the state change of the output of the first logic means; and second logic means, coupled to the outputs of the first and second sample means, for presenting at an output the logical OR combination thereof.

10. A circuit as in claim 9, further comprising an adjustable delay device coupled between the first logic means and the data input of the first sample means.

11. A circuit as in claim 9, further comprising an adjustable delay device coupled between the first logic means and the trigger input of the second sample means.

12. A circuit as in claim 9, further comprising an adjustable delay device, for receiving the window signal, coupled to the trigger input of the first sample means.

13. A circuit as in claim 9, further comprising an adjustable delay device, for receiving the window signal, coupled to the data input of the second sample means.

14. A circuit as in claim 9, further comprising storage means, coupled to the output of the second logic means, for storing the output of the second logic means upon receipt of a storage signal at a trigger input and for presenting said stored output at an output thereafter.

15. A circuit as in claim 14, wherein the storage signal is a falling edge of the window signal.

16. A circuit as in claim 15, further comprising an inverter coupled to the trigger input of the storage means, said inverter being operative for receiving and inverting the window signal.

17. A circuit as in claim 9, wherein:

the second sample means includes a reset input for receiving a reset signal; and the second sample means is operative for resetting its output to a binary 0 upon receipt of a reset signal.

18. A circuit as in claim 17, further comprising:

third logic means, having a first inverting input for receiving and inverting the window signal and a second inverting input coupled to a complementary output of the second sample means, said third logic means being operative for performing a logical AND operation and for presenting the result at an output;

fourth logic means, having a first input coupled to the output of the third logic means and a second input for receiving a mode signal, the fourth logic means being operative for performing a logical OR operation and for presenting the result at an output coupled to a reset input of the second sample means; and wherein the second sample means is operative for resetting its output to a logical 0 upon receipt of a logical 1 at the reset input.

* * * * *